(12) United States Patent
Chen et al.

(10) Patent No.: US 9,337,061 B2
(45) Date of Patent: May 10, 2016

(54) FABRICATION METHOD OF SEMICONDUCTOR PACKAGE

(71) Applicant: Siliconware Precision Industries Co., Ltd, Taichung (TW)

(72) Inventors: Yan-Heng Chen, Taichung (TW);
Chun-Tang Lin, Taichung (TW);
Mu-Hsuan Chan, Taichung (TW);
Chieh-Yuan Chi, Taichung (TW);
Yan-Yi Liao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/151,153

(22) Filed: Jan. 9, 2014

(65) Prior Publication Data

US 2014/0342505 A1 Nov. 20, 2014

(30) Foreign Application Priority Data

May 20, 2013 (TW) .............................. 102117714 A

(51) Int. Cl.
| | |
|---|---|
| *H01L 21/00* | (2006.01) |
| *H01L 21/52* | (2006.01) |
| *H01L 21/78* | (2006.01) |
| *H01L 23/00* | (2006.01) |
| *H01L 21/56* | (2006.01) |

(52) U.S. Cl.
CPC ................ *H01L 21/52* (2013.01); *H01L 21/78* (2013.01); *H01L 24/19* (2013.01); *H01L 24/96* (2013.01); *H01L 21/568* (2013.01); *H01L 2224/12105* (2013.01); *H01L 2924/181* (2013.01)

(58) Field of Classification Search
CPC .......................... H01L 2224/98; H01L 21/568
USPC ............. 438/124, 126, 127, 112, 106, 25, 26; 257/E21.502, E21.499
See application file for complete search history.

(56) References Cited

U.S. PATENT DOCUMENTS

| | | | |
|---|---|---|---|
| 2011/0121449 A1* | 5/2011 | Lin et al. .................... | 257/737 |
| 2013/0249106 A1* | 9/2013 | Lin et al. .................... | 257/774 |

* cited by examiner

*Primary Examiner* — Julia Slutsker
(74) *Attorney, Agent, or Firm* — Mintz Levin Cohn Ferris Glovsky and Popeo, P.C.; Peter F. Corless; Steven M. Jensen

(57) ABSTRACT

A fabrication method of a semiconductor package is disclosed, which includes the steps of: providing a carrier; disposing at least a semiconductor element on the carrier; forming an encapsulant on the carrier and the semiconductor element for encapsulating the semiconductor element; removing the carrier; disposing a pressure member on the encapsulant; and forming an RDL structure on the semiconductor element and the encapsulant, thereby suppressing internal stresses through the pressure member so as to mitigate warpage on edges of the encapsulant.

10 Claims, 4 Drawing Sheets

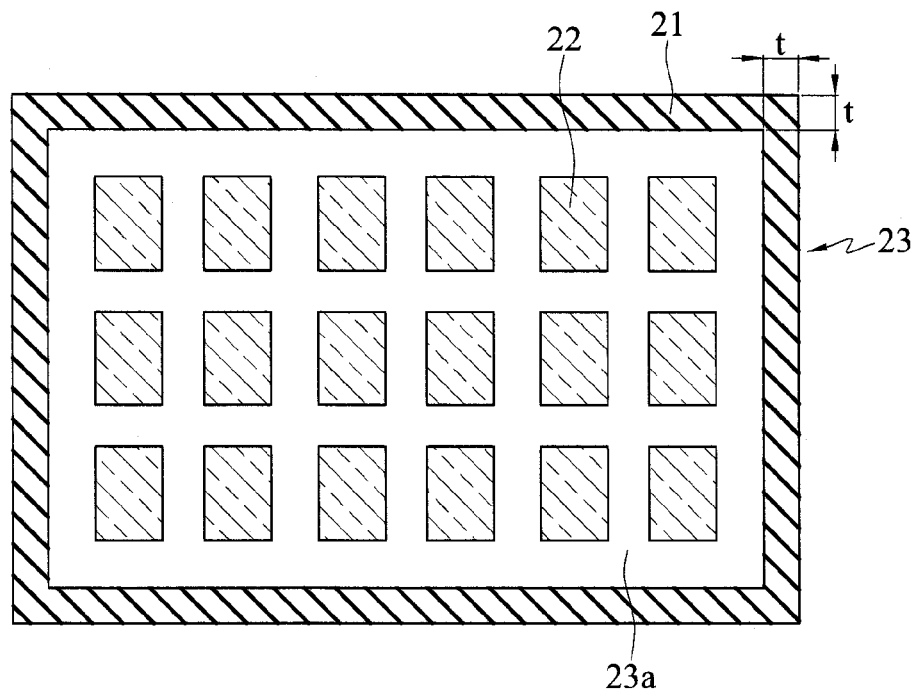
FIG. 2D'
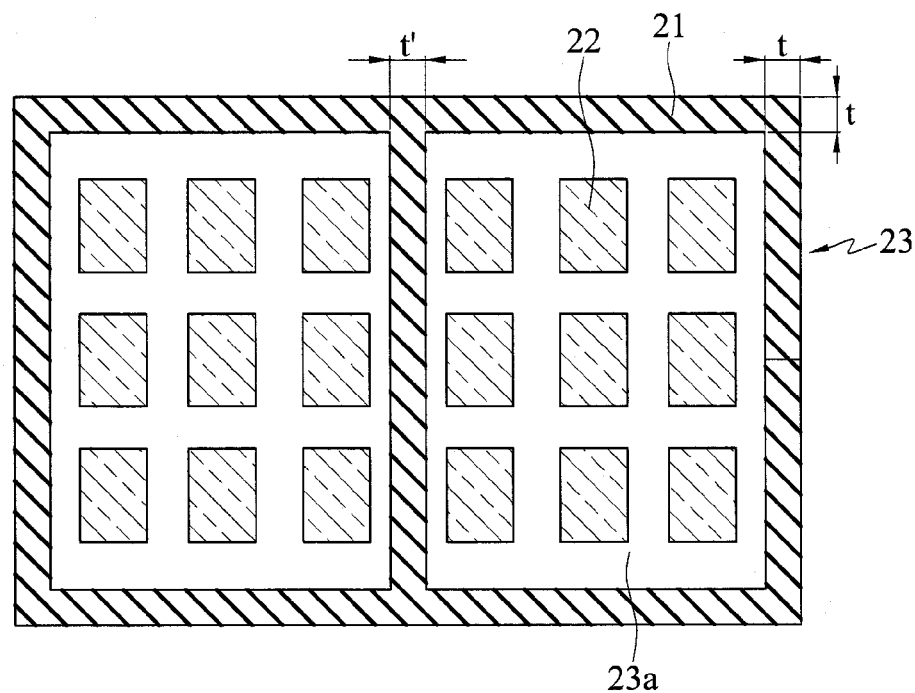
FIG. 2D"

ated May 20,
FABRICATION METHOD OF SEMICONDUCTOR PACKAGE

CROSS-REFERENCES TO RELATED APPLICATIONS

This application claims under 35 U.S.C. §119(a) the benefit of Taiwanese Application No. 102117714, filed May 20, 2013, the entire contents of which is incorporated herein by reference.

BACKGROUND OF THE INVENTION

1. Field of the Invention

The present invention relates to fabrication methods of semiconductor packages, and more particularly, to a fabrication method of a semiconductor package for improving the product reliability.

2. Description of Related Art

Along with the rapid development of electronic industries, electronic products are developed towards multi-function and high electrical performance. Accordingly, fan out packaging technologies have been developed to meet the miniaturization requirement of semiconductor packages.

FIGS. 1A to 1D are schematic cross-sectional views showing a fabrication method of a fan out semiconductor package 1 according to the prior art.

Referring to FIG. 1A, a carrier 10 is provided and an adhesive layer 11 is formed on the carrier 10.

Then, a plurality of semiconductor elements 12 are disposed on the adhesive layer 11. Each of the semiconductor elements 12 has an active surface 12a with a plurality of electrode pads 120 and a non-active surface 12b opposite to the active surface 12a. The semiconductor elements 12 are attached to the adhesive layer 11 via the active surfaces 12a thereof.

Referring to FIG. 1B, an encapsulant 13 is laminated on the adhesive layer 11 for encapsulating the semiconductor elements 12.

Referring to FIG. 1C, a curing process is performed to cure the encapsulant 13, and then the adhesive layer 11 and the carrier 10 are removed to expose the active surfaces 12a of the semiconductor elements 12.

Referring to FIG. 1D, an RDL (Redistribution Layer) process is performed to form an RDL structure 14 on the encapsulant 13 and the active surfaces 12a of the semiconductor elements 12. The RDL structure 14 is electrically connected to the electrode pads 120 of the semiconductor elements 12.

Then, an insulating layer 15 is formed on the RDL structure 14, and portions of the RDL structure 14 are exposed from the insulating layer 15 so as for a plurality of conductive elements 16 such as solder bumps to be mounted thereon.

However, large stresses may be generated during the curing process of the encapsulant 13 and dispersed by the carrier 10. As such, referring to FIG. 1D', warpage easily occurs on edges of the encapsulant 13 after the carrier 10 is removed. Therefore, it becomes difficult for the RDL structure 14 to be aligned with the electrode pads 120 of the semiconductor elements 12. The greater the size of the carrier 10 is, the more severe the position tolerance between the semiconductor elements 12 becomes, thereby adversely affecting the electrical connection between the RDL structure 14 and the semiconductor elements 12. As such, the product reliability and yield are reduced.

Therefore, there is a need to provide a fabrication method of a semiconductor package so as to overcome the above-described drawbacks.

SUMMARY OF THE INVENTION

In view of the above-described drawbacks, the present invention provides a fabrication method of a semiconductor package, which comprises the steps of: providing a carrier; disposing at least a semiconductor element on the carrier, wherein the semiconductor element has an active surface with a plurality of electrode pads and a non-active surface opposite to the active surface, and the semiconductor element is disposed on the carrier via the active surface thereof; forming an encapsulant on the carrier and the semiconductor element for encapsulating the semiconductor element, wherein the encapsulant has a first surface bonded to the carrier and a second surface opposite to the first surface, and the encapsulant further has a pressure area defined around the semiconductor element; removing the carrier to expose the first surface of the encapsulant and the active surface of the semiconductor element; disposing at least a pressure member on the pressure area of the encapsulant; and forming an RDL structure on the active surface of the semiconductor element and the first surface of the encapsulant, wherein the RDL structure is electrically connected to the electrode pads of the semiconductor element.

In the above-described method, the pressure member can have a frame.

In the above-described method, two pressure members can be disposed on both the first surface and the second surface of the encapsulant, respectively. For example, the pressure area of the encapsulant can be sandwiched between the pressure members.

In the above-described method, the at least a pressure member can be made of an iron material or a magnetic body.

In the above-described method, the at least a pressure member can be disposed on only one of the first surface and the second surface of the encapsulant.

In the above-described method, the encapsulant can be formed by molding, thin film laminating or printing.

In the above-described method, the pressure area can be located on edges of the first or second surface of the encapsulant.

In the above-described method, if a plurality of semiconductor elements are provided, the pressure area can further be located between any two adjacent ones of the semiconductor elements.

The above-described method can further comprise forming on the RDL structure an insulating layer having a plurality of openings for exposing portions of the RDL structure.

The above-described method can further comprise performing a singulation process after forming the RDL structure, and the at least a pressure member can be removed through the singulation process.

According to the present invention, after the carrier is removed, the pressure member is disposed on the pressure area of the encapsulant for providing a support force to keep the structure flat, thereby mitigating warpage of the encapsulant.

As such, warpage of the encapsulant does not increase as the size of the carrier increases. Therefore, the RDL structure can be effectively aligned with and electrically connected to the semiconductor element so as to improve the product reliability and yield and reduce the fabrication cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "on", "first", "second" etc. are merely for illustrative purposes and should not be construed to limit the scope of the present invention.

FIGS. 2A to 2F are schematic cross-sectional views showing a fabrication method of a semiconductor package 2 according to the present invention.

Figure 1A:
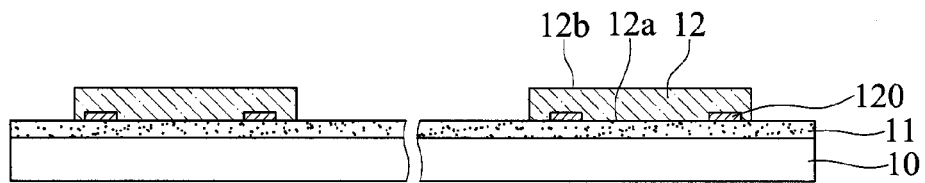
FIGS. 1A to 1D are schematic cross-sectional views showing a conventional fabrication method of a semiconductor package, wherein FIG. 1D' shows warpage of the structure of FIG. 1C.
Figure 1B:
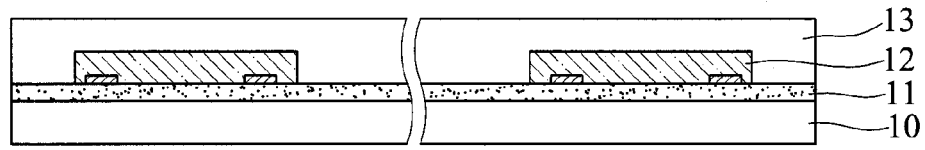
Figure 1C:
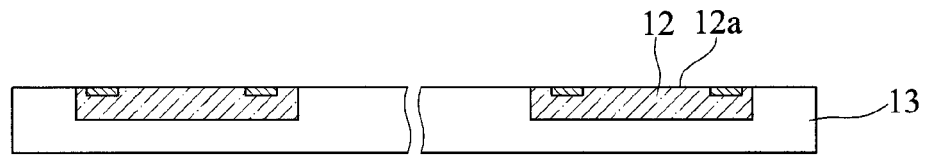
Figure 1D:
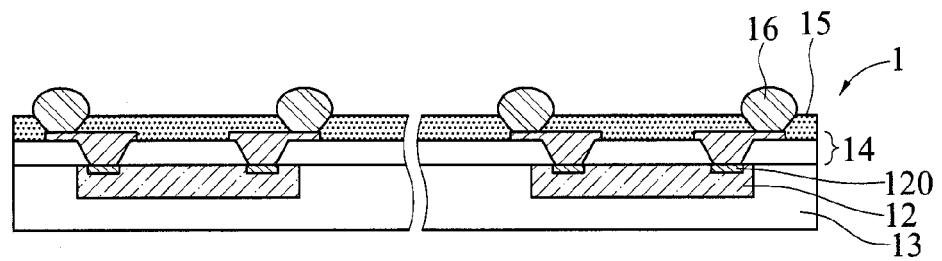
Figure 1D:
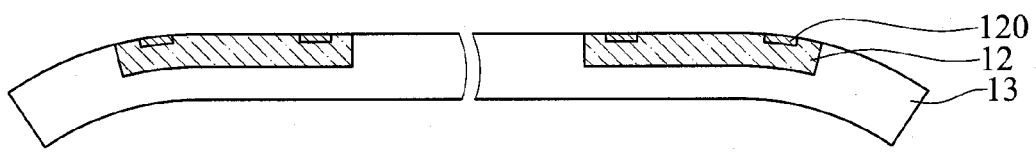
Figure 2A:
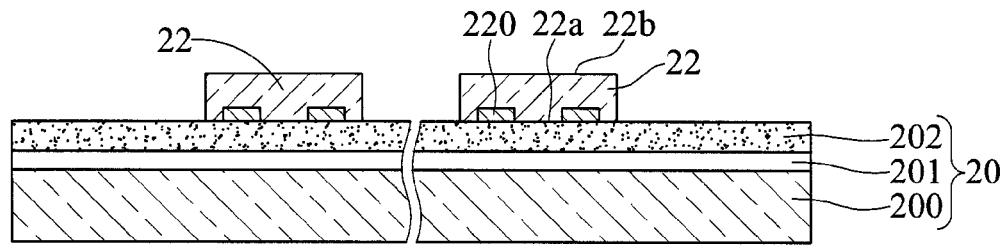
FIGS. 2A to 2F are schematic cross-sectional views showing a fabrication method of a semiconductor package according to the present invention, wherein FIG. 2D' is an upper view of FIG. 2D, FIG. 2D" is an upper view showing another embodiment of FIG. 2D.

Referring to FIG. 2A, a carrier 20 is provided, and a plurality of semiconductor elements 22 are array arranged on the carrier 20.

In the present embodiment, the carrier 20 can be a wafer type substrate or a panel type substrate. The carrier 20 can have a base board 200 made of glass, and a release layer 201 and an adhesive layer 202 sequentially formed on the base board 200.

Each of the semiconductor elements 22 has an active surface 22a with a plurality of electrode pads 220 and a non-active surface 22b opposite to the active surface 22a. The semiconductor elements 22 are attached to the adhesive layer 202 via the active surfaces 22a thereof.

Figure 2B:
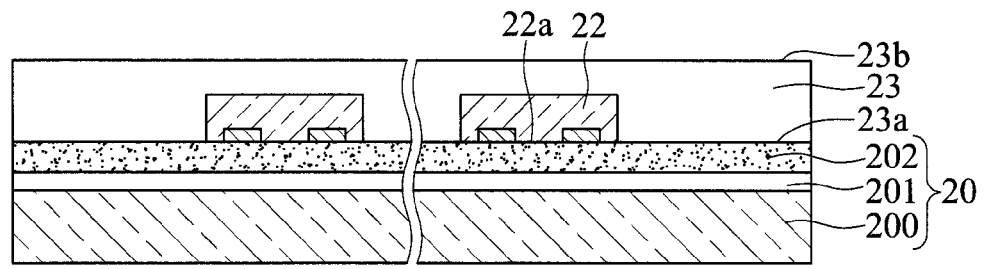
Figure 2C:
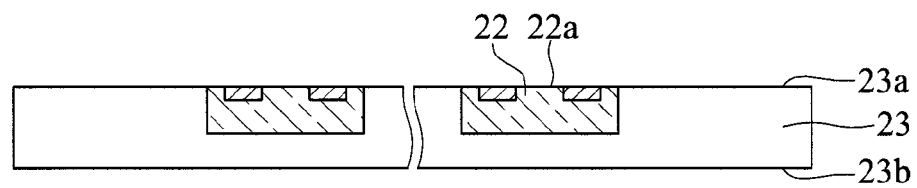
Figure 2D:
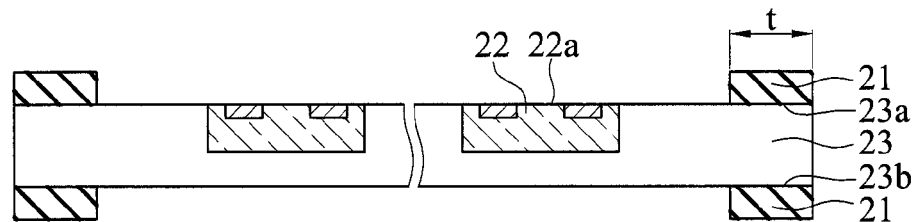

Referring to FIGS. 2B and 2D', an encapsulant 23 is formed on the adhesive layer 202 of the carrier 20 and the semiconductor elements 22 for encapsulating the semiconductor elements 22. The encapsulant 23 has a first surface 23a bonded to the carrier 20 and a second surface 23b opposite to the first surface 23a. The encapsulant 23 further has a pressure area t defined around the semiconductor elements 22.

In the present embodiment, the encapsulant 23 is made of a thin film and formed through laminating, or made of an adhesive material and formed through printing. In other embodiments, the encapsulant 23 can be made of a molding compound and formed through a molding process.

Generally, the encapsulant 23 needs to be cured through a heating process, thus increasing internal stresses of the encapsulant 23. The internal stresses can be dispersed by the carrier 20.

The pressure area t can be located on edges of the first surface 23a or the second surface 23b of the encapsulant 23.

Further, the active surfaces 22a of the semiconductor elements 22 are coplanar with the first surface 23a of the encapsulant 23.

Referring to FIG. 2C, the carrier 200 and the release layer 201 and the adhesive layer 202 on the carrier 200 are removed to expose the first surface 23a of the encapsulant 23 and the active surfaces 22a of the semiconductor elements 22.

Referring to FIGS. 2D and 2D', a pressure member 21 is disposed on the pressure area t of the encapsulant 23.

In the present embodiment, the pressure member 21 is of a frame and has two portions respectively disposed on the first and second surfaces 23a, 23b of the encapsulant 23. The two portions of the pressure member 21 are aligned with each other so as to sandwich the pressure area t of the encapsulant 23 between them. Preferably, the two portions of the pressure member 21 are made of an iron material or mutually attractive magnetic bodies.

In another embodiment, the two portions of the pressure member 21 can be not aligned with each other.

In another embodiment, the pressure member 21 can be disposed on only one of the first surface 23a and the second surface 23b of the encapsulant 23.

Referring to FIG. 2D", a pressure area t' is further defined between the semiconductor elements 22 so as for the pressure member 21 to be disposed thereon.

According to the present invention, after the carrier 20 is removed, the pressure member 21 provides a support force to keep the structure flat, thereby mitigating warpage of the encapsulant 23.

Figure 2E:
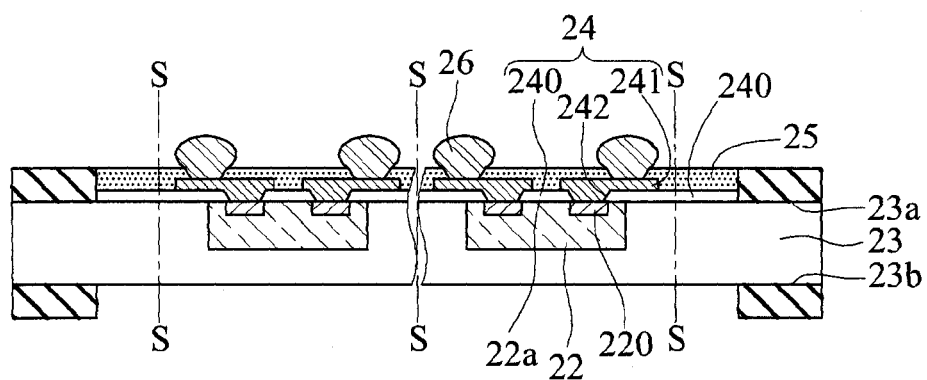

Referring to FIG. 2E, an RDL process is performed to form an RDL structure 24 on the active surfaces 22a of the semiconductor elements 22 and the first surface 23a of the encapsulant 23. The RDL structure 24 is electrically connected to the electrode pads 220 of the semiconductor elements 22.

In the present embodiment, the RDL structure 24 has a dielectric layer 240 formed on the first surface 23a of the encapsulant 23 and the active surfaces 22a of the semiconductor elements 22, a circuit layer 241 formed on the dielectric layer 240, and a plurality of conductive vias 242 formed in the dielectric layer 240 for electrically connecting the circuit layer 241 and the electrode pads 220 of the semiconductor elements 22.

Thereafter, an insulating layer 25 is formed on the RDL structure 24 and has a plurality of openings for exposing portions of the circuit layer 241. Then, a plurality of conductive elements 26 such as solder bumps are formed on the exposed portions of the circuit layer 241.

The dielectric layer 240 can be made of polyimide (PI), benezocyclobutene (BCB) or polybenzoxazole (PBO).

In other embodiments, the RDL structure can have a plurality of dielectric layers 240 and a plurality of circuit layers 241 formed on the dielectric layers 240.

Figure 2F:
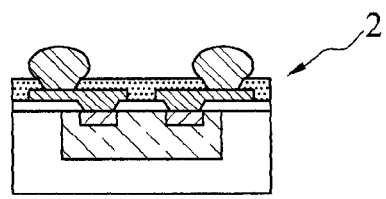

Referring to FIG. 2F, a singulation process is performed along cutting paths S of FIG. 2E so as to obtain a plurality of semiconductor packages 2. Also, the pressure member 21 is removed through the singulation process.

According to the present invention, the pressure member 21 is disposed on the pressure area t of the encapsulant 23 for providing a support force to keep the structure flat, thereby mitigating warpage of the encapsulant 23.

Therefore, warpage of the encapsulant 23 does not increase as the size of the carrier 20 becomes larger. Accordingly, the conductive vias 242 of the RDL structure 24 can be effectively aligned with and electrically connected to the electrode pads 220 of the semiconductor elements 22 so as to improve the product reliability and yield and reduce the fabrication cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a semiconductor package, comprising the steps of:
 providing a carrier;
 disposing at least a semiconductor element on the carrier, wherein the semiconductor element has an active surface with a plurality of electrode pads formed thereon and a non-active surface opposite to the active surface, and the semiconductor element is disposed on the carrier via the active surface thereof;
 forming an encapsulant on the carrier and the semiconductor element for encapsulating the semiconductor element, wherein the encapsulant has a first surface bonded to the carrier and a second surface opposite to the first surface, and the encapsulant further has a pressure area defined around the semiconductor element;
 removing the carrier to expose the first surface of the encapsulant and the active surface of the semiconductor element;
 disposing a number of pressure members on the pressure area of the encapsulant in direct contact with the first surface and the second surface of the encapsulant, respectively; and
 forming a redistribution layer (RDL) structure on the active surface of the semiconductor element and the first surface of the encapsulant, wherein the RDL structure is electrically connected to the electrode pads of the semiconductor element.

2. The method of claim 1, wherein the pressure members have a frame.

3. The method of claim 1, wherein the number of pressure members is more than two, and the pressure area of the encapsulant is sandwiched between any two adjacent ones of the pressure members.

4. The method of claim 1, wherein the pressure members are made of an iron material or a magnetic body.

5. The method of claim 1, wherein the encapsulant is formed by molding, thin film laminating or printing.

6. The method of claim 1, wherein the pressure area is located on edges of the first or second surface of the encapsulant.

7. The method of claim 1, wherein a plurality of the semiconductor elements are provided, and the pressure area is further located between any two adjacent ones of the semiconductor elements.

8. The method of claim 1, further comprising forming on the RDL structure an insulating layer having a plurality of openings for exposing portions of the RDL structure.

9. The method of claim 1, after forming the RDL structure, further comprising performing a singulation process.

10. The method of claim 9, wherein the pressure members are removed through the singulation process.

* * * * *